(12) United States Patent
Ishii et al.

(10) Patent No.: US 8,154,190 B2
(45) Date of Patent: Apr. 10, 2012

(54) LIGHT EMITTING DEVICE WITH RESIN LAYER CONTAINING BLUE, GREEN AND RED EMITTING PHOSPHORS WHICH EMITS WHITE LIGHT WHEN EXCITED BY ULTRAVIOLET LIGHT

(75) Inventors: Tsutomu Ishii, Yokohama (JP); Yasuhiro Shirakawa, Yokohama (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 716 days.

(21) Appl. No.: 11/575,630

(22) PCT Filed: Sep. 8, 2005

(86) PCT No.: PCT/JP2005/016556
§ 371 (c)(1),
(2), (4) Date: Mar. 20, 2007

(87) PCT Pub. No.: WO2006/033239
PCT Pub. Date: Mar. 30, 2006

(65) Prior Publication Data
US 2007/0215892 A1    Sep. 20, 2007

(30) Foreign Application Priority Data
Sep. 22, 2004 (JP) .................................. 2004-274857

(51) Int. Cl.
*H05B 33/04* (2006.01)
(52) U.S. Cl. ....................................... 313/503; 313/512
(58) Field of Classification Search .................. None
See application file for complete search history.

(56) References Cited

U.S. PATENT DOCUMENTS

| 6,066,861 | A | 5/2000 | Hohn et al. | |
|---|---|---|---|---|
| 6,319,425 | B1 * | 11/2001 | Tasaki et al. | 252/301.36 |
| 7,023,019 | B2 * | 4/2006 | Maeda et al. | 257/89 |
| 2002/0163302 | A1 * | 11/2002 | Nitta et al. | 313/512 |
| 2004/0066140 | A1 * | 4/2004 | Omoto | 313/512 |

(Continued)

FOREIGN PATENT DOCUMENTS

EP    0 862 794    9/1998

(Continued)

OTHER PUBLICATIONS

Machine translation of JP2001148516.*

(Continued)

*Primary Examiner* — Toan Ton
*Assistant Examiner* — Britt D Hanley
(74) *Attorney, Agent, or Firm* — Oblon, Spivak, McClelland, Maier & Neustadt, L.L.P.

(57) ABSTRACT

A light emitting device 1 has, as a light source, a light emitting semiconductor element such as a light emitting diode 2. Light radiated from the light emitting diode 2 is converted to visible light in a light emitting part 8 having a plurality of phosphors 9 different in emission color, and the visible light is emitted. In such a light emitting device 1, a maximum value ($\Delta x$, $\Delta y$) of color difference (absolute value) between emission chromaticity (x, y) and emission chromaticity (x1, y1) satisfies conditions of $\Delta x<0.05$ and $\Delta y<0.05$, where (x, y) is emission chromaticity measured directly above the light source and (x1, y1) is emission chromaticity measured for each of front lights and side leakage lights in all directions from the light emitting device 1.

11 Claims, 6 Drawing Sheets

U.S. PATENT DOCUMENTS

2005/0211991 A1* 9/2005 Mori et al. .................. 257/79
2006/0071591 A1* 4/2006 Takezawa et al. ............ 313/501

FOREIGN PATENT DOCUMENTS

| | | |
|---|---|---|
| EP | 1 249 873 A2 | 10/2002 |
| EP | 1 249 873 A3 | 10/2002 |
| JP | 9 62205 | 3/1997 |
| JP | 11-500584 | 1/1999 |
| JP | 2000-31530 | 1/2000 |
| JP | 2000 73052 | 3/2000 |
| JP | 2003 160785 | 6/2003 |
| JP | 2003 318447 | 11/2003 |
| JP | 2004 4626 | 1/2004 |
| JP | 2004 501512 | 1/2004 |
| JP | 2004 153109 | 5/2004 |
| JP | 2004 221163 | 8/2004 |
| JP | 2003-197979 | 7/2011 |
| WO | WO 98/12757 | 3/1998 |

OTHER PUBLICATIONS

Japan Office Action issued Jun. 14, 2011, in Japan Patent Application No. 2006-536340, filed Jun. 6, 2011 (with English-language Translation).

Japanese Office Action mailed Nov. 22, 2011 in corresponding JP Application No. 2006-536340 (w/English Translation).

* cited by examiner

LIGHT EMITTING DEVICE WITH RESIN LAYER CONTAINING BLUE, GREEN AND RED EMITTING PHOSPHORS WHICH EMITS WHITE LIGHT WHEN EXCITED BY ULTRAVIOLET LIGHT

TECHNICAL FIELD

The present invention relates to a light emitting device which has, as a light source, a light emitting semiconductor element such as a light emitting diode, and a backlight and a liquid crystal display including the same.

BACKGROUND ART

A light emitting diode (LED) is a semiconductor element converting electric energy to light such as ultraviolet light or visible light to radiate the light, and a LED lamp in which such a LED chip is sealed by, for example, transparent resin is used in various fields. To realize a visible-light LED lamp, a LED chip having a light emitting layer made of GaP, GaAsP, GaAlAs, GaN, InGaAlP, or the like is used. To use, as a light source, a light emitting semiconductor element such as a laser diode instead of the light emitting diode has been also considered.

Being semiconductor elements, a light emitting diode and a laser diode have advantages that they have long life and high reliability, and when they are used as a light source, an exchange work is lightened. Therefore, LED lamps using, for example, a LED chip are widely used in industrial application as backlights, various switches, and so on in displays such as liquid crystal displays in mobile communication equipment, PC peripheral equipment, OA equipment, household electric equipment, and so on, and also used in general lighting application.

Color tone of light radiated from a LED lamp depends not only on emission wavelength of a LED chip. For example, phosphors contained in transparent resin sealing a LED chip can provide lights in a visible light spectrum from blue to red according to an intended use. Further, a function of reproducing subtle color tone with higher definition has recently been requested of various displays. Accordingly, there is a demand for enabling one LED lamp to emit white light and lights in various neutral colors.

In particular, LED lamps emitting white light have rapidly come into wide use as backlights of liquid crystal displays, vehicle lamps, and the like, and their application range is expected to greatly expand as substitutes for fluorescent lamps in future. As white light emitting LED lamps currently in actual or experimental use, there have been known a lamp in which blue emitting LED chip and a yellow emitting phosphor (YAG), and further a red emitting phosphor are combined, and a lamp in which an ultraviolet emitting LED chip and a mixture of blue, green, and red emitting phosphors are combined (for example, see Patent Documents 1, 2).

The former white LED lamp is more widely used at present than the latter white LED lamp because the former is superior in brightness characteristic and so on to the latter. However, the former has a disadvantage that the emitted light appears yellowish depending on a line of sight, and unevenness of yellow and white appears when the light is projected onto a white surface. For this reason, emission color of the former white lamp is sometimes called pseudo white. On the other hand, the latter white LED lamp using the ultraviolet emitting LED chip has an advantage that it can provide emitted light and projected light with small unevenness, though being inferior in brightness to the former. For this reason, the latter white LED lamp is expected to be a mainstream of white lamps for lighting use in future, and the development thereof is rapidly progressing.

In the course of the development of the white LED lamp using the ultraviolet emitting LED chip, it has been found out that unevenness in emitted light and projected light also occurs in a white LED lamp in which an ultraviolet emitting LED chip and plurality of phosphors different in emission color are combined, even though a degree of the unevenness is not as high as that in a white LED lamp using a blue emitting LED chip. It has been also found out that a phenomenon occurs that light leaking from a side face of the LED lamp (side leakage light) has color different from intended white color. Such a phenomenon (nonuniformity of light) is not preferable in using the LED lamp in a lighting device and the like, and causes deterioration in quality and characteristic thereof.

Patent Document 1: JP-A 2000-073052 (KOKAI)
Patent Document 2: JP-A 2003-160785 (KOKAI)

DISCLOSURE OF THE INVENTION

It is an object of the present invention to provide a light emitting device with improved quality and characteristic in a case where a light emitting semiconductor element such as a light emitting diode or a laser diode is used in combination with a plurality of phosphors different in emission color. It is another object of the present invention to provide a backlight and a liquid crystal display to which such a light emitting device is applied.

A light emitting device according to one aspect of the present invention is a light emitting device including: a light source including a light emitting semiconductor element; and a light emitting part including a plurality of phosphors different in emission color and emitting visible light when excited by light from the light source, wherein a maximum value ($\Delta x$, $\Delta y$) of color difference (absolute value) between emission chromaticity (x, y) and emission chromaticity (x1, y1) satisfies conditions of $\Delta x<0.05$ and $\Delta y<0.05$, where (x, y) is emission chromaticity measured directly above the light source and (x1, y1) is emission chromaticity measured for front lights and side leakage lights in all directions from the light emitting device.

A backlight according to one aspect of the present invention includes the above-described light emitting device of the present invention. A liquid crystal display according to one aspect of the present invention includes: a backlight including the above-described light emitting device of the present invention; and a transmissive or transreflective liquid crystal display part disposed on a light emission surface side of the backlight.

BEST MODE FOR CARRYING OUT THE INVENTION

Hereinafter embodiments of the present invention will be described with reference to the drawings. The drawings are provided only for an illustrative purpose and are not intended to limit the present invention, though the embodiments of the present invention will be described based on the drawings below.

Figure 1:
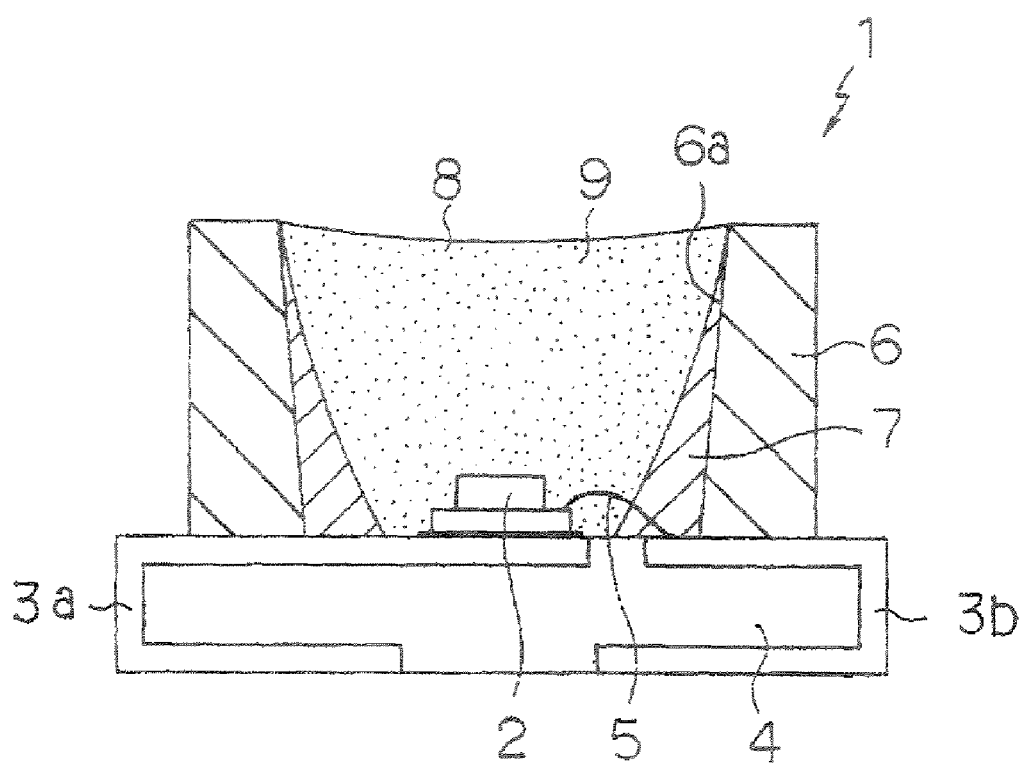
FIG. 1 is a cross-sectional view showing the structure of a light emitting device according to one embodiment of the present invention.

FIG. 1 is a vertical cross-sectional view showing the structure of one embodiment in which the light emitting device of the present invention is applied to a LED lamp. A light emitting device (LED lamp) 1 shown in the drawing has a LED chip 2 as a light source. It should be noted that the light source of the light emitting device 1 is not limited to the LED chip 2, but may be a laser diode (semiconductor laser) or the like. The LED chip 2 is mounted on a substrate 4 having a pair of lead terminals 3a, 3b. A lower electrode of the LED chip 2 is electrically and mechanically connected to the lead terminal 3a. An upper electrode of the LED chip 2 is electrically connected to the lead terminal 3b via a bonding wire 5.

In the light emitting device 1, a light source emitting, for example, ultraviolet light is used. Therefore, as the light source, the LED chip 2 emitting the ultraviolet light is used. The LED chip 2 of such an ultraviolet emission type has an emission wavelength, typically, in a range from 360 to 420 nm. An example of the ultraviolet emitting LED chip 2 is a LED chip having a light emitting layer made of a nitride compound semiconductor layer. Incidentally, the emission wavelength of the LED chip 2 may be any, providing that intended emission color can be obtained based on the combination of a plurality of phosphors different in emission color. Therefore, the LED chip 2 is not limited to a LED chip having the emission wavelength within a range from 360 to 420 nm. Further, a light emitting semiconductor element (laser diode or the like) other than the LED chip may be used as the light source.

On the substrate 4, a cylindrical resin frame 6 is provided, and on its inner wall surface 6a, a reflection layer 7 is formed. Transparent resin 8 is filled in the resin frame 6, and the LED chip 2 is buried in the transparent resin 8. The LED chip 2 is covered by the transparent resin 8. The transparent resin 8 in which the LED chip 2 is buried contains a mixed phosphor 9 which is a mixture of a plurality of phosphors different in emission color. The mixed phosphor 9 dispersed in the transparent resin 8 emits visible light when excited by light radiated from the LED chip 2, for example, by ultraviolet light.

The transparent resin 8 containing the several (two or more) kinds of phosphors (mixed phosphor 9) different in emission color functions as a light emitting part and is disposed in front of the LED chip 2 in a light emission direction. As the transparent resin 8, for example, silicone resin, epoxy resin, or the like is used. The kind and combination of the several phosphors are appropriately selected according to intended emission color of the LED lamp 1 and are not specifically limited. For example, in a case where the LED lamp 1 is used as a white light emitting lamp, a mixture of a blue emitting phosphor, a green emitting phosphor, and a red emitting phosphor is used. To obtain emission color other than white, two kinds or more of the phosphors selected from the blue emitting phosphor, the green emitting phosphor, the red emitting phosphor, and so on can be appropriately combined for use.

The phosphor 9 used in the LED lamp 1 is not limited to a specific one, but it is preferable to use a phosphor efficiently absorbing the light radiated from the LED chip 2, for example ultraviolet light in a wavelength range of 360 to 420 nm. A concrete example of the red emitting phosphor is a rare earth oxysulfide phosphor activated by trivalent europium and samarium ($R_2O_2S$:Eu, Sm phosphor (R is at least one kind of element selected from La, Y, and Gd. In particular, R preferably contains at least La.)).

Examples of the blue emitting phosphor are a halophosphate phosphor activated by bivalent europium, an aluminate phosphor activated by bivalent europium, an aluminate phosphor activated by bivalent europium and manganese, and so on. Example of the green emitting phosphor are an aluminate phosphor activated by bivalent europium and manganese, an alkaline earth silicate phosphor activated by bivalent europium, a rare earth silicate phosphor activated by trivalent terbium and cerium, and so on.

The above mentioned phosphors all have excellent absorption efficiency to ultraviolet light. The LED lamp 1 structured by the combination of the mixed phosphor (BGR phosphor) 9 containing such blue, green, and red phosphors and the ultraviolet emitting LED chip 2 whose emission wavelength is within a range from 360 to 420 nm can provide white light at a given color temperature with good reproducibility. More specifically, a LED lamp structured by the combination of a blue emitting LED chip and a yellow emitting phosphor (YAG phosphor or the like) is difficult to provide uniform white light due to variation in emission wavelength of a LED chip, deterioration in emission efficiency caused by heat generation of the LED chip, color shift, and so on. Further, the mixture of yellowish white related to light emitted by the yellow emitting phosphor causes deterioration in color tone and uniformity of white light.

On the other hand, in the LED lamp 1 structured by the combination of the ultraviolet emitting LED chip 2 and the three-color mixed phosphor (BGR phosphor) 9, lights forming white color are all emitted from the phosphors, and direct involvement of the light radiated from the LED chip 2 is small. Therefore, white color excellent in color reproducibility can be more uniformly obtained. That is, even if there is variation in emission wavelength of the LED chip 2, color reproducibility of white light can be enhanced since the LED lamp 1 obtains white light only from the light emitted from the BGR phosphor 9. Further, the same applies to a case where emission efficiency and emission wavelength change due to the heat generation of the LED chip. The same also applies to a case where neutral color light other than white light is obtained.

The several kinds of phosphors different in emission color do not necessarily have to be disposed in the entire transparent resin 8 filled in the resin frame 6, but for example, with an area around the LED chip 2 being potted only by transparent resin, an area outside of this potted area may be filled with transparent resin containing the plural phosphors. A reverse manner may be also adopted. Alternatively, the transparent resin 8 containing the several kinds of phosphors may be disposed only in part of the inside of the resin frame 6. In any case, the transparent resin containing the several kinds of phosphors different in emission color functions as a light emitting part.

Electric energy applied to the LED lamp 1 is converted to ultraviolet light and violet light by the LED chip 2 and these lights are converted to lights with longer wavelength by the phosphor 9 dispersed in the transparent resin 8. Then, color, for example, white light, based on the combination of the several kinds of phosphors contained in the transparent resin 8 is emitted from the LED lamp 1. The LED lamp 1 functions as, for example, a white lamp. Here, most of the lights emitted from the phosphors including light reflected on the reflection layer 7 are emitted efficiently to the front of the LED lamp 1 (to the upper area in the drawing). However, part of the lights transmits through the resin frame 6 and the reflection layer 7 to be emitted as side leakage light in a side direction.

The LED lamp 1 of this embodiment can provide more uniform light since difference among emission chromaticities measured for its front lights and side leakage lights in all directions is small. Concretely, a maximum value ($\Delta x$, $\Delta y$) of color difference (absolute value) between emission chromaticity (x, y) and emission chromaticity (x1, y1) satisfies conditions of $\Delta x<0.05$ and $\Delta y<0.05$, where (x, y) is emission chromaticity measured directly above the LED chip 2 as the light source, and (x1, y1) is emission chromaticity measured for front lights and side leakage lights in all directions from the LED lamp 1. Satisfying such emission chromaticity difference ($\Delta x<0.05$, $\Delta y<0.05$) makes it possible to greatly improve quality and characteristic when the LED lamp 1 is used as a lighting device and the like.

Figure 2:
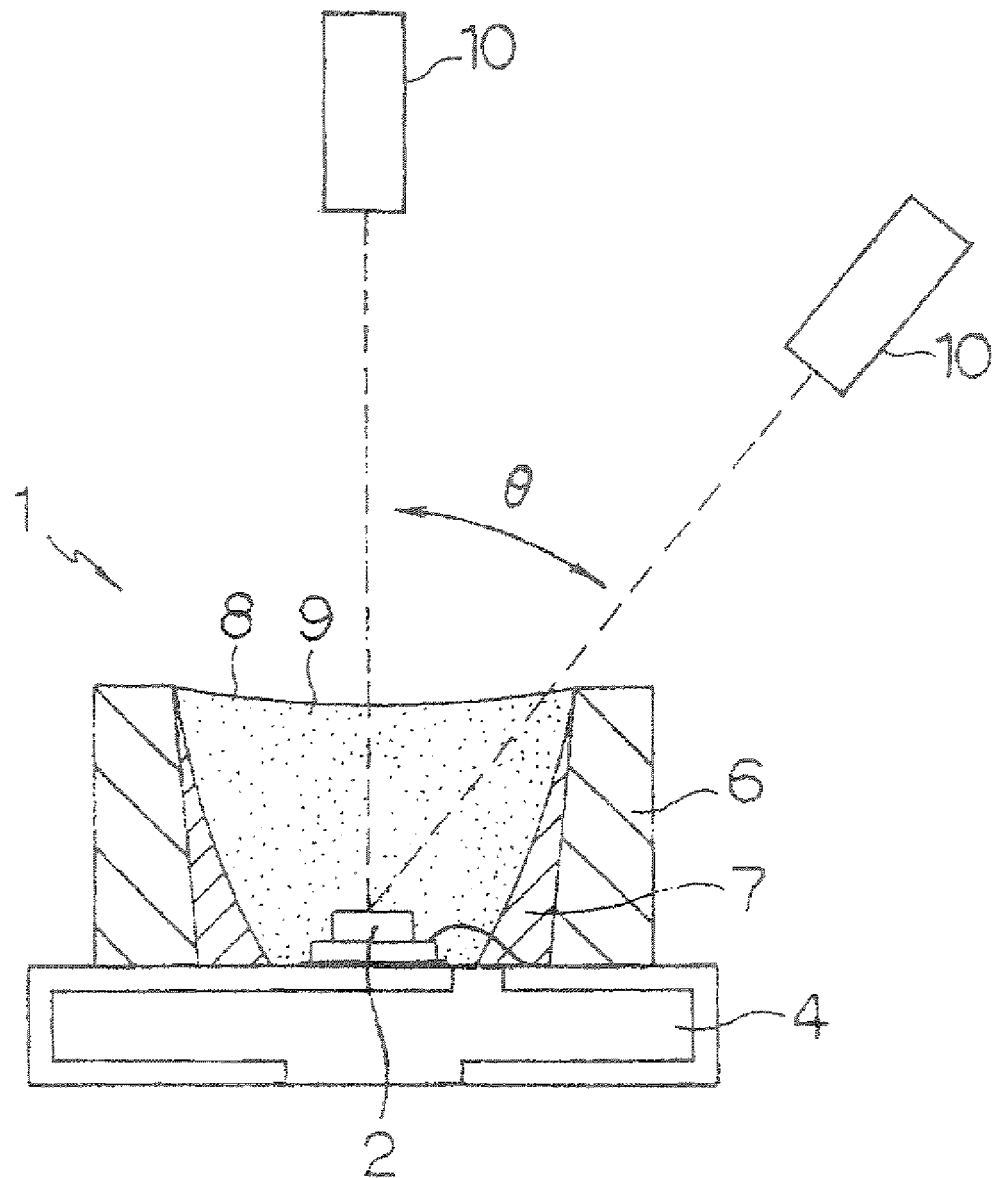
FIG. 2 is a view to explain a method of measuring emission chromaticity in all directions from the light emitting device.

The emission chromaticity difference ($\Delta x$, $\Delta y$) is measured in the following manner. First, as shown in FIG. 2, a sensor 10 of a color meter is disposed on a plumb line extending from the center of the LED chip 2, and at this position, the emission chromaticity (x, y) directly above the LED chip 2 is measured. When emission intensity is too strong, an attenuator such as a resin plate is used. Next, the emission chromaticity (x1, y1) is measured under varied angle $\theta$ which is an angle of a line connecting the LED chip 2 and the sensor 10 relative to the plumb line, with the plumb line direction as zero degree. When the emission chromaticity at a given angle $\theta$ is (x1, y1), difference between these chromaticities is recognized as nonuniformity in light emission. Such emission chromaticity (x1, y1) is measured for the front lights and side leakage lights in all directions.

According to the above-described method, the emission chromaticities (x1, y1) of the front lights and side leakage lights in all directions from the LED lamp 1 are measured. Normally, the measurement until the angle $\theta$ reaches 90 degrees suffices. A difference (x−x1, y−y1) between the emission chromaticity (x1, y1) in each direction and the emission chromaticity (x, y) measured directly above the LED chip 2 is calculated as an absolute value. Then, the maximum value of these chromaticity differences is defined as ($\Delta x$, $\Delta y$). According to the LED lamp 1 of this embodiment, the maximum value ($\Delta x$, $\Delta y$) of the emission chromaticity differences satisfies the conditions of $\Delta x<0.05$ and $\Delta y<0.05$. The emission chromaticity difference is more preferably in a range of $\Delta x<0.035$ and $\Delta y<0.035$, and still more preferably in a range of $\Delta x<0.025$ and $\Delta y<0.025$.

The LED lamp 1 of this embodiment is excellent in emission uniformity since the emission color difference satisfies the conditions of $\Delta x<0.05$ and $\Delta y<0.05$ as described above. Such a LED lamp 1 can be obtained with high reproducibility by the use of a plurality of phosphors satisfying one of or both of the following condition (a) and condition (b). The condition (a) is to satisfy a condition of $-0.2<\{(D1)^2 \times w1\} - \{(D2)^2 \times w2\}<0.2$, where D1 (μm) and w1 (g/mm³) are an average particle size and a density, respectively, of one phosphor out of the plural phosphors, and D2 (μm) and w2 (g/mm³) are an average particle size and a density, respectively, of another phosphor. The condition (b) is to combine and integrate the plural phosphors in advance by an inorganic binder.

In a case where the red emitting phosphor among blue, green, and red phosphors constituting a white LED lamp is larger in density than the blue and red emitting phosphors, if a phosphor in which these three-color phosphors are simply mixed is added to the transparent resin 8, only the red emitting phosphor settles down quicker before a curing process. It is thought that a nonuniform dispersion state of the phosphors ascribable to such a difference in settling velocity causes phenomena such as unevenness in emitted light and projected light and color shift of the side leakage light. Therefore, the blue, green, and red phosphors are bound and integrated by the inorganic binder in advance, and the BGR phosphor 9 which is a mixture of the three phosphors is dispersed in this state in the transparent resin 8. This can achieve a uniform dispersion state of the phosphors in the transparent resin 8.

The phosphor made of the plural phosphors bound and integrated by the inorganic binder can be obtained in the following manner, for instance. First, several kinds of phosphor powders are put into water to make a suspension. While this suspension is stirred, micronized alkaline earth borate or the like is added as the inorganic binder, and in this state, the resultant is stirred for a prescribed time. A ratio of the added inorganic binder to the total amount of the several phosphors is preferably 0.01 to 0.3 mass %. Thereafter, the stirring is stopped, and the phosphors are settled down, followed by filtration, drying, and several-hour baking at a temperature of 300° C. or higher. Then, by a process such as sieving, the phosphor made of the bound and integrated phosphors can be obtained.

Figure 3:
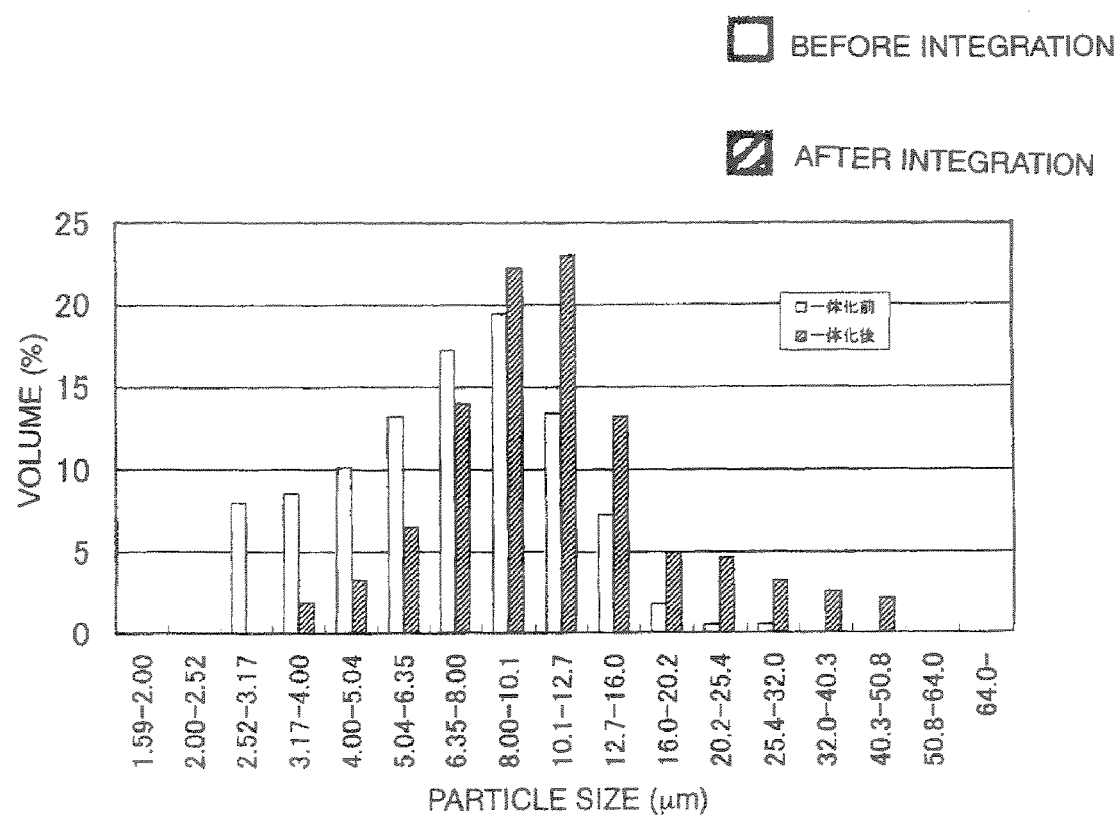
FIG. 3 is a chart showing the comparison of particle size distribution before three kinds of blue, green, and red phosphors are integrated and particle size distribution after they are integrated.

FIG. 3 shows an example of particle size distribution of the three-color mixed phosphor (BGR phosphor) before and after the integration process. It is seen that by the integration process, the three kinds of phosphors are bound at random and the particle size distribution shifts toward a large particle size side. FIG. 3 shows a case where the phosphors are integrated by alkaline earth borate whose addition amount is 0.1 mass % relative to the phosphors, and a median (50% value) which is an average of the particle size distribution is increased to 10.5 μm from 7.3 μm which is a value before the process. Thus, the phosphors having undergone the integration process are bound at random to be integrated. The use of the complex phosphor 9 made of such integrated phosphors makes it possible to uniformly disperse the phosphors in the transparent resin 8.

Further, integrating the phosphors by the inorganic binder makes it possible to inhibit deterioration in emission chromaticity and emission efficiency ascribable to deterioration of the binder, because of excellent light fastness of the binder itself. For example, in a case where the phosphors are integrated by an organic binder, the organic binder, depending on the kind of organic resin, is deteriorated by the light from the LED chip 2, in particular, by ultraviolet light, and white turbidity and coloring may possibly occur with time. This causes deterioration in emission chromaticity and emission efficiency of the LED lamp 1. In this respect, owing to excellent UV resistance of the inorganic binder, the LED lamp 1 using the phosphors integrated by the inorganic binder can stably maintain emission chromaticity and emission efficiency for a long time.

The uniform dispersion state of the phosphors in the transparent resin 8 can also be realized by controlling particle size according to a density of each of the phosphors. That is, controlling particle size balance based on the density of each of the phosphors to equalize the settling velocity makes it possible to uniformly disperse the phosphors in the transparent resin 8. Concretely, the condition represented by the following expression is satisfied:

$$-0.2 < \{(D1)^2 \times w1\} - \{(D2)^2 \times w2\} < 0.2 \quad \text{Expression: (1)},$$

where D1 (μm) and w1 (g/mm³) are an average particle size and a density, respectively, of one phosphor among the phosphors, and D2 (μm) and w2 (g/mm³) are an average particle size and a density, respectively, of another phosphor.

The average particle size D represents a median (50% value) of the particle size distribution. Here, in a case where three kinds or more of phosphors are used as the phosphors, it is preferable that the particle size balance (a value of $\{(D1)^2 \times w1\} - \{(D2)^2 \times w2\}$) in each combination of the phosphors satisfies the condition of the expression (1). For example, in a case where the blue, green, and red phosphors are used, the condition of the expression (1) is preferably satisfied in the combination of the blue emitting phosphor and the green emitting phosphor, the combination of the blue emitting phosphor and the red emitting phosphor, and the combination of the green emitting phosphor and the red emitting phosphor.

If the particle size balance in any of the combinations of the phosphors is not greater than −0.2 or not smaller than 0.2, the phosphors greatly vary in the settling velocity and thus become nonuniform in the dispersion state in the transparent resin 8. For example, when the average particle size D1 and density w1 of a first phosphor are 10 μm and 4×10⁻³ g/mm³ respectively and the density w2 of a second phosphor is 5×10⁻³ g/mm³, the average particle size D2 of the second phosphor is desirably within a range from 6.3 to 11 μm. The particle size balance between the phosphors is more preferably within a range of not smaller than −0.15 nor greater than 0.15.

Table 1 shows an example of emission chromaticity differences of a conventional LED lamp using a BGR phosphor in which phosphors are simply mixed (lamp 1), a LED lamp using a BGR phosphor having undergone the integration process (lamp 2), a LED lamp using a BGR phosphor satisfying the particle size balance represented by the expression (1) (lamp 3), and a LED lamp (lamp 4) using a BGR phosphor satisfying both the integration process and the particle size balance. The specific gravity of the blue emitting phosphor is 4.2×10⁻³ g/mm³, the specific gravity of the green emitting phosphor is 3.8×10⁻³ g/mm³, and the specific gravity of the red emitting phosphor is 5.7×10⁻³ g/mm³.

TABLE 1

| | Mixed Phosphor | | | Emission Chromaticity Difference | |
| --- | --- | --- | --- | --- | --- |
| | Integration Process | Particle Size Balance | D-w Value | Δx | Δy |
| LED lamp 1 | not applied | not satisfied | blue 0.151 green 0.186 red 0.514 | 0.1 | 0.1 |
| LED lamp 2 | applied | not satisfied | blue 0.151 green 0.186 red 0.514 | 0.045 | 0.035 |
| LED lamp 3 | not applied | satisfied | blue 0.605 green 0.642 red 0.628 | 0.040 | 0.030 |
| LED lamp 4 | applied | satisfied | blue 0.605 green 0.642 red 0.628 | 0.020 | 0.0185 |

As shown in Table 1, the use of the phosphor having undergone the integration process and the phosphor satisfying the particle size balance represented by the expression (1) makes it possible to provide a LED lamp excellent in emission uniformity. It is also seen that the particle size balance represented by the expression (1) is also effective to the phosphor to which the integration process is applied. This is because uniformity at the time of the integration process is improved. By thus using the phosphor having undergone the integration process and the phosphor satisfying the particle size balance represented by the expression (1), it is possible to obtain a LED lamp excellent in emission uniformity. Further, the use of the phosphor satisfying the both conditions can achieve still higher emission uniformity of the LED lamp.

Figure 4:
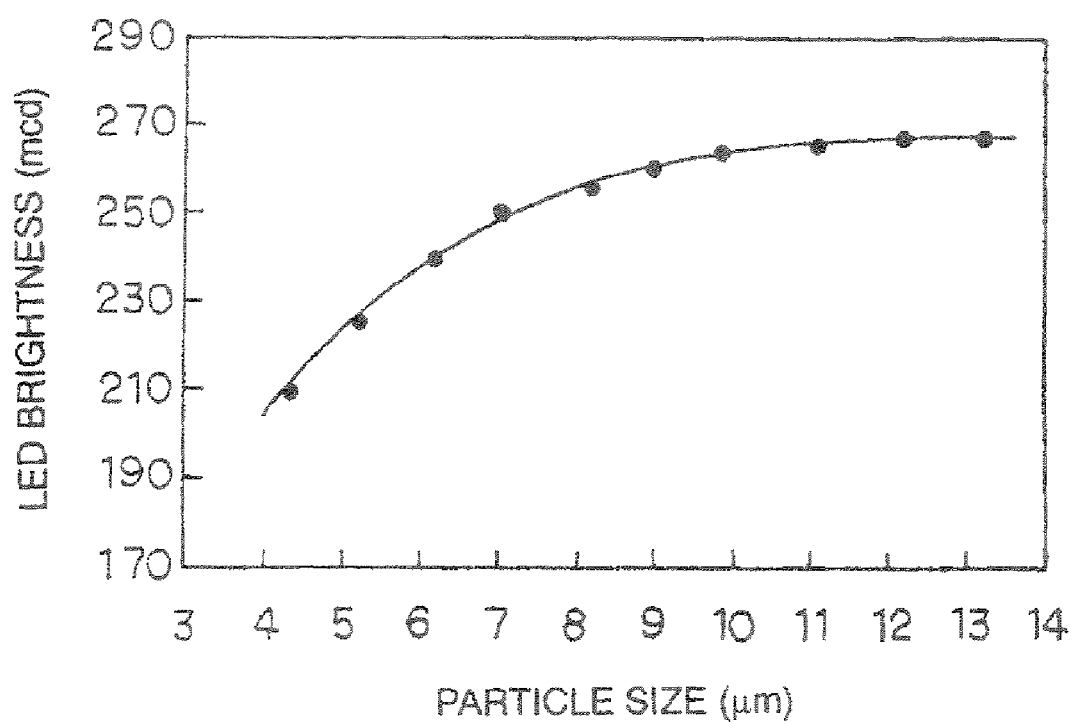
FIG. 4 is a chart showing an example of how brightness of a LED lamp correlates with an average particle size of a mixed phosphor which is a mixture of the three kinds of blue, green, and red phosphors.

A brightness characteristic of the LED lamp 1 is influenced by particle size of the mixed phosphor 9 containing the phosphors. From this viewpoint, an average particle size of the phosphors as the mixture is preferably 7 μm or more. The average particle size mentioned here means a median (50% value) of the particle size distribution. FIG. 4 shows an example of the correlation between the average particle size of the three-color mixed phosphor (BGR phosphor) and brightness of the LED lamp. As is apparent from FIG. 4, when the average particle size of the BGR phosphor as a mixture is 7 μm or more, brightness of the LED lamp 1 can be enhanced. The average particle size of the mixed phosphor is more preferably 8 μm or more. Improving brightness based on the average particle size of the mixed phosphor is effective to the phosphor having undergone the integration process and the phosphor satisfying the particle size balance represented by the expression (1).

Figure 5:
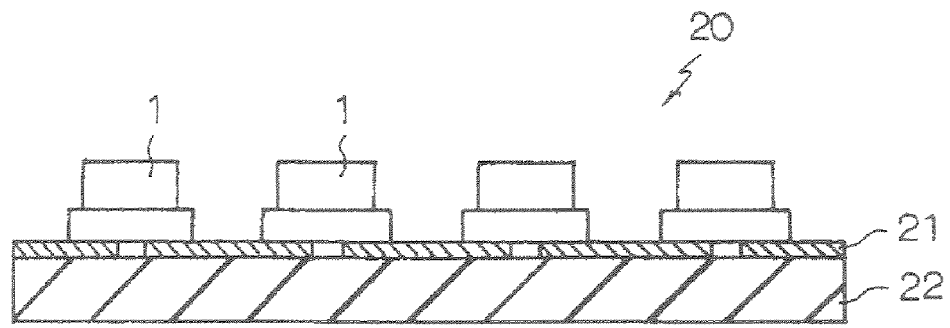
FIG. 5 is a view showing a schematic structure of a backlight according to one embodiment of the present invention.

The LED lamp 1 of this embodiment is usable for various purposes as, for example, lighting device. A typical application example of the LED lamp 1 is a backlight of various displays, typically, a liquid crystal display. FIG. 5 is a view showing a schematic structure of a backlight according to one embodiment of the present invention. A backlight 20 shown in the drawing has the plural LED lamps 1 arranged in line or in matrix. These LED lamps 1 are mounted on a substrate 22 having a wiring layer 21, and lead terminals of the LED lamps 1 are electrically connected to the wiring layer 21. The plural LED lamps 1 are serially connected in sequence. It should be noted that a light emitting part of the backlight 20 is not limited to the LED lamps 1, but a light emitting device using a light emitting semiconductor element such as a laser diode as a light source is usable.

Figure 6:
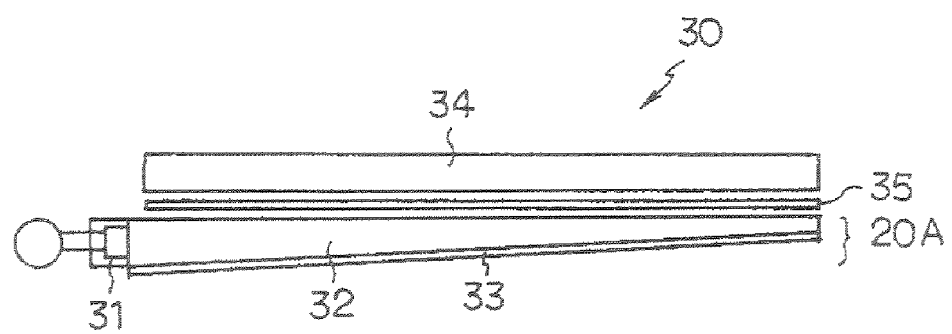
FIG. 6 is a view showing a schematic structure of a liquid crystal display according to one embodiment of the present invention.
Figure 7:
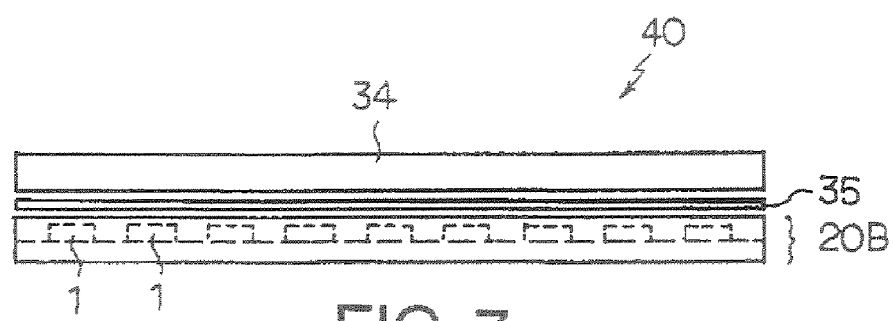
FIG. 7 is a view showing a schematic structure of a liquid crystal display according to another embodiment of the present invention.

The backlight 20 described above is applied to, for example, liquid crystal displays 30, 40 as shown in FIG. 6 and FIG. 7. The liquid crystal displays 30, 40 shown in these drawings are embodiments of the liquid crystal display of the present invention. FIG. 6 shows the liquid crystal display 30 to which a sidelight-type backlight 20A is applied. The sidelight-type backlight 20A has a light emitting part 31 and an optical waveguide 32. One end surface of the optical waveguide 32 is an optical incident part, and the light emitting part 31 is disposed in this end surface.

The optical waveguide 32 is tapered from the one end surface as the light incident part toward the other end surface, and a reflection layer 33 is disposed on a lower surface side of a tapered portion. Light radiated from the light emitting part 31 repeats refraction and reflection in the optical waveguide 32 to be radiated from an upper surface of the optical waveguide 32 in its normal direction. A transmissive or transreflective color liquid crystal display part 34 is disposed on a light emitting surface side of the sidelight-type backlight 20A and these components constitute the liquid crystal display 30. Between the sidelight-type backlight 20A and the color liquid crystal display part 34, an optical sheet 35 such as a diffusion sheet or a reflection sheet may be disposed.

FIG. 7 shows the liquid crystal display 40 to which a direct-type backlight 20B is applied The direct-type backlight 20B has the LED lamps 1 arranged in matrix according to the shape and area of the transmissive or transreflective color liquid crystal display part 34. The color liquid crystal display part 34 is directly disposed on an emission direction side of the plural LED lamps 1 constituting the backlight 20B. The direct-type backlight 20B and the color liquid display part 34 as described above, and if necessary, the optical sheet 35 disposed therebetween constitute the liquid crystal display 40.

Next, concrete examples of the present invention and evaluation results thereof will be described.

Example 1

First, a europium-activated alkaline earth chlorophosphate $((Sr, Ca, Ba, Eu)_{10}(PO_4)_6.Cl_2))$ phosphor was prepared as a blue emitting phosphor, a europium, manganese-activated alkaline earth aluminate $(3(Ba, Mg, Eu, Mn)O.8Al_2O_3)$ phosphor was prepared as a green emitting phosphor, and a europium, samarium-activated lanthanum oxysulfide $((La, Eu, Sm)_2O_2S)$ phosphor was prepared as a red emitting phosphor. Here, the blue emitting phosphor with a 6.0 μm average particle size, the green emitting phosphor with a 7.0 μm average particle size, and the red emitting phosphor with a 9.5 μm average particle size were used. An average particle size of these phosphors as a mixture is 8.8 μm.

1.3 g, 2 g, and 10 g of the above-described blue emitting phosphor, green emitting phosphor, and red emitting phosphors were weighed respectively, and they were integrated by the following method. A mixture ratio of the phosphors was set so that a CIE chromaticity value (x, y) of the LED lamp falls in a range of x=0.28 to 0.36 and y=0.28 to 0.36. The same applies also to the following examples 2 to 14 and comparative examples 1 and 2. In the integration process, first, powders of the phosphors were put into water to make a suspension. While this suspension was stirred, barium-calcium borate $(3(Ba, Ca)O.B_2O_3)$ was added at a ratio of 0.1 mass % relative to the total amount of the phosphors. The stirring was stopped after continued for 30 minutes, and the phosphors were settled down. After filtrated and baked, they were passed through a 200-mesh nylon sieve, whereby an integrated three-color mixed phosphor (BGR phosphor) was obtained.

The LED lamp 1 shown in FIG. 1 was fabricated with the use of thus obtained integrated phosphor. In a fabrication process of the LED lamp 1, first, the integrated phosphor at a ratio of 30 mass % was mixed in silicone resin forming the transparent resin 8 to make a slurry. Part of the slurry was taken out and dropped onto the ultraviolet emitting LED chip 2 with an emission wavelength of 395 nm, and the silicone resin was cured at 140° C. In this manner, the ultraviolet emitting LED chip 2 was sealed by the silicone resin containing the integrated BGR phosphor, whereby the LED lamp 1 was fabricated. The obtained LED lamp was subjected to later-described characteristic evaluation.

Example 2

An integrated three-color mixed phosphor (BGR phosphor) was fabricated in the same manner as in the example 1 except in that a blue emitting phosphor with a 12.0 μm average particle size, a green emitting phosphor with a 13.0 μm average particle size, and a red emitting phosphor with a 10.5 μm average particle size were used instead of those in the above-described example 1. Further, a LED lamp was fabricated in the same manner as in the example 1 with the use of this integrated phosphor. This LED lamp was subjected to the later-described characteristic evaluation.

Example 3

An integrated three-color mixed phosphor (BGR phosphor) was fabricated in the same manner as in the example 1 except in that the addition amount of barium-calcium borate in the integration process in the above-described example 1 was changed to 0.2 mass % relative to the total amount of the phosphors. A LED lamp was fabricated in the same manner as in the example 1 with the use of this integrated phosphor. This LED lamp was subjected to the later-described characteristic evaluation.

Example 4

An integrated three-color mixed phosphor (BGR phosphor) was fabricated in the same manner as in the example 1 except in that in the integration process in the above-described example 1, a barium-calcium-magnesium borate was used and an addition amount of this barium-calcium-magnesium borate was 0.2 mass % relative to the total amount of the phosphors. A LED lamp was fabricated in the same manner as in the example 1 with the use of this integrated phosphor. This LED lamp was subjected to the later-described characteristic evaluation.

Example 5

An integrated three-color mixed phosphor (BGR phosphor) was fabricated in the same manner as in the example 1 except in that a blue emitting phosphor with a 10.5 μm average particle size, a green emitting phosphor with a 11.0 μm average particle size, and a red emitting phosphor with a 9.0 μm average particle size were used instead of those in the above-described example 1. A LED lamp was fabricated in the same manner as in the example 1 with the use of this integrated phosphor. This LED lamp was subjected to the later-described characteristic evaluation.

Example 6

An integrated three-color mixed phosphor (BGR phosphor) was fabricated in the same manner as in the example 5 except in that the addition amount of barium-calcium borate in the integration process in the above-described example 5 was changed to 0.3 mass % relative to the total amount of the phosphors. A LED lamp was fabricated in the same manner as in the example 1 with the use of this integrated phosphor. This LED lamp was subjected to the later-described characteristic evaluation.

Example 7

In the phosphors with the same composition as in the above-described example 1, phosphor powder with a 6 μm average particle size was prepared as the blue emitting phosphor (specific gravity=4.2 g/mm³), phosphor powder with a 7 μm average particle size was prepared as the green emitting phosphor (specific gravity=3.8 g/mm³), and phosphor powder with a 7 μm average particle size was prepared as the red emitting phosphor (specific gravity=5.7 g/mm³). The calculation of the particle size balance among these phosphors represented by the aforesaid expression (1) gives −0.035 for the particle size balance between the blue emitting phosphor (D1) and the green emitting phosphor (D2) −0.128 for the particle size balance between the blue emitting phosphor (D1) and the red emitting phosphor (D2), and −0.093 for the particle size balance between the green emitting phosphor (D1) and the red emitting phosphor (D2), and thus all of them satisfy the particle size balance of the above expression (1).

Next, a mixture of the above phosphors was added to silicone resin to make a slurry. An amount thereof mixed in the silicone resin was set so that the total ratio of the phosphors became 30 mass %. Part of this slurry was taken out to be dropped onto the ultraviolet emitting LED chip 2 with a 395 nm emission wavelength, and the silicone resin was cured at 140°. In this manner, the ultraviolet emitting LED chip 2 was sealed by the silicone resin containing the blue, green, and red phosphors, whereby the LED lamp 1 was fabricated. The obtained LED lamp was subjected to the later-described characteristic evaluation.

Example 8

In the phosphors with the same composition as in the above-described example 1, phosphor powder with a 12 μm average particle size was prepared as the blue emitting phosphor (specific gravity=4.2 g/mm$^3$), phosphor powder with a 13 μm average particle size was prepared as the green emitting phosphor (specific gravity=3.8 g/mm$^3$), and phosphor powder with a 10.5 μm average particle size was prepared as the red emitting phosphor (specific gravity=5.7 g/mm$^3$). The calculation of the particle size balance among these phosphors represented by the aforesaid expression (1) gives −0.037 for the particle size balance between the blue emitting phosphor (D1) and the green emitting phosphor (D2), −0.024 for the particle size balance between the blue emitting phosphor (D1) and the red emitting phosphor (D2), and 0.014 for the particle size balance between the green emitting phosphor (D1) and the red emitting phosphor (D2), and thus all of them satisfy the particle size balance of the above expression (1). A LED lamp was fabricated in the same manner as in the example 7 with the use of these phosphors. This LED lamp was subjected to the later-described characteristic evaluation.

Example 9

In the phosphors with the same composition as in the above-described example 1, phosphor powder with a 10.5 μm average particle size was prepared as the blue emitting phosphor (specific gravity=4.2 g/mm$^3$), phosphor powder with an 11 μm average particle size was prepared as the green emitting phosphor (specific gravity=3.8 g/mm$^3$), and phosphor powder with a 9 μm average particle size was prepared as the red emitting phosphor (specific gravity=5.7 g/mm$^3$). The calculation of the particle size balance among these phosphors represented by the aforesaid expression (1) gives 0.003 for the particle size balance between the blue emitting phosphor (D1) and the green emitting phosphor (D2), 0.001 for the particle size balance between the blue emitting phosphor (D1) and the red emitting phosphor (D2), and −0.002 for the particle size balance between the green emitting phosphor (D1) and the red emitting phosphor (D2), and thus all of them satisfy the particle size balance of the above expression (1). A LED lamp was fabricated in the same manner as in the example 7 with the use of these phosphors. This LED lamp was subjected to the later-described characteristic evaluation.

Comparative Example 1

A blue emitting phosphor, a green emitting phosphor, and a red emitting phosphor with the same composition, same particle size, and same amount as those of the example 1 were prepared. Among these phosphors, the particle size balance between the blue emitting phosphor and the red emitting phosphor is −0.363, and the particle size balance between the green emitting phosphor and the red emitting phosphor is −0.328, and thus neither falls within the range of the particle size balance of the above expression (1). A mixture of these phosphors was added to silicone resin to make a slurry. An amount thereof mixed in the silicone resin was set so that the total ratio of the phosphors became 30 mass %. Part of the slurry was taken out to be dropped onto the ultraviolet emitting LED chip 2 with a 395 emission wavelength and the silicone resin was cured at 140° C., whereby the ultraviolet emitting LED chip 2 was sealed by the silicone resin containing the blue, green, and red phosphors which were not integrated. A LED lamp thus fabricated was subjected to the later-described characteristic evaluation.

Example 10

First, an europium-activated alkaline earth chlorophosphate $((Sr, Ca, Ba, Eu)_{10}(PO_4)_6.Cl_2)$ phosphor was prepared as a blue emitting phosphor, an europium-activated alkaline earth silicate $(Ba, Sr, Ca, Eu)_2SiO_4$ phosphor was prepared as a green emitting phosphor, and an europium, samarium-activated lanthanum oxysulfide $((La, Eu, Sm)_2O_2S)$ phosphor was prepared as a red emitting phosphor. Next, 8.0 g of the blue emitting phosphor with a 5.9 μm average particle size, 1.5 g of the green emitting phosphor with a 10.0 μm average particle size, and 6 g of the red emitting phosphor with a 9.0 μm particle size were weighed, and they were integrated in the same manner as in the example 1. A LED lamp was fabricated in the same manner as in the example 1 with the use of this integrated phosphor (BGR phosphor). This LED lamp was subjected to the later-described characteristic evaluation.

Example 11

An integrated three-color mixed phosphor (BGR phosphor) was fabricated in the same manner as in the example 10 except in that a blue emitting phosphor with a 8.6 μm average particle size, a green emitting phosphor with a 10.0 μm average particle size, and a red emitting phosphor with a 11.9 μm average particle size were used instead of those in the above-described example 10. A LED lamp was fabricated in the same manner as in the example 10 with the use of this integrated phosphor. This LED lamp was subjected to the later-described characteristic evaluation.

Example 12

An integrated three-color mixed phosphor (BGR phosphor) was fabricated in the same manner as in the example 10 except in that a blue emitting phosphor with a 12.0 μm average particle size, a green emitting phosphor with a 10.0 μm average particle size, and a red emitting phosphor with a 13.2 μm average particle size were used instead of those in the above-described example 10. A LED lamp was fabricated in the same manner as in the example 10 with the use of this integrated phosphor. This LED lamp was subjected to the later-described characteristic evaluation.

Example 13

A integrated three-color mixed phosphor (BGR phosphor) was fabricated in the same manner as in the example 10 except in that a blue emitting phosphor with a 5.0 μm average particle size, a green emitting phosphor with a 7.0 μm average particle size, and a red emitting phosphor with a 8.0 μm average particle size were used instead of those in the above-described example 10. A LED lamp was fabricated in the same manner as in the example 10 with the use of this integrated phosphor. This LED lamp was subjected to the later-described characteristic evaluation.

Example 14

An integrated three-color mixed phosphor (BGR phosphor) was fabricated in the same manner as in the example 10 except in that a blue emitting phosphor with a 4.0 μm average particle size, a green emitting phosphor with a 6.0 μm average particle size, and a red emitting phosphor with a 7.0 μm average particle size were used instead of those in the above-described example 10. A LED lamp was fabricated in the same manner as in the example 1 with the use of this integrated phosphor. This LED lamp was subjected to the later-described characteristic evaluation.

Comparative Example 2

A blue emitting phosphor, a green emitting phosphor, and a red emitting phosphor with the same composition, same particle size, and same amount as those of the example 14 were prepared. A mixture of these phosphors was mixed in silicone resin to make a slurry. An amount thereof mixed in the silicone resin was set so that the total ratio of the phosphors became 30 mass %. Part of the slurry was taken out to be dropped onto an ultraviolet emitting LED chip with a 395 nm emission wavelength and the silicone resin was cured at 140° C., whereby the ultraviolet emitting LED chip was sealed by the silicone resin containing the blue, green and red phosphors which were not integrated A LED lamp thus fabricated was subjected to the later-described characteristic evaluation.

20 mA current was passed through the LED lamps of the examples 1 to 14 and the comparative examples 1, 2 described above to light them, and regarding the lamps, emission brightness and emission chromaticity differences (Δx, Δy) in all the directions based on the aforesaid method were measured. Table 2 shows results of these measurements.

TABLE 2

| | Mixed Phosphor | | | LED Lamp | | |
| | | | | Emission | | |
| | Average Particle Size (μm) | Integration Process | Particle Size Balance | Chromaticity Difference | | Brightness (mcd) |
| | | | | Δx | Δy | |
|---|---|---|---|---|---|---|
| E1 | 8.8 | applied | not satisfied | 0.045 | 0.035 | 100 |
| E2 | 11.0 | applied | satisfied | 0.020 | 0.018 | 115 |
| E3 | 8.8 | applied | not satisfied | 0.044 | 0.033 | 100 |
| E4 | 8.8 | applied | not satisfied | 0.045 | 0.034 | 100 |
| E5 | 9.4 | applied | satisfied | 0.010 | 0.010 | 110 |
| E6 | 9.4 | applied | satisfied | 0.011 | 0.010 | 110 |
| E7 | 6.9 | not applied | satisfied | 0.035 | 0.025 | 95 |
| E8 | 11.0 | not applied | satisfied | 0.021 | 0.019 | 115 |
| E9 | 9.4 | not applied | satisfied | 0.017 | 0.017 | 110 |
| CE1 | 8.8 | not applied | not satisfied | 0.1 | 0.1 | 100 |
| E10 | 7.2 | applied | not satisfied | 0.040 | 0.030 | 250 |

TABLE 2-continued

| | Mixed Phosphor | | | LED Lamp | | |
| | | | | Emission | | |
| | Average Particle Size (μm) | Integration Process | Particle Size Balance | Chromaticity Difference | | Brightness (mcd) |
| | | | | Δx | Δy | |
|---|---|---|---|---|---|---|
| E11 | 9.9 | applied | not satisfied | 0.043 | 0.033 | 263 |
| E12 | 12.2 | applied | not satisfied | 0.045 | 0.035 | 266 |
| E13 | 6.2 | applied | not satisfied | 0.040 | 0.030 | 240 |
| E14 | 5.2 | applied | not satisfied | 0.041 | 0.032 | 225 |
| CE2 | 5.2 | not applied | not satisfied | 0.15 | 0.10 | 225 |

E1 to E14 = Example 1 to Example 14;
CE1 to CE2 = Comparative Example 1 to Comparative Example 2

As is apparent from Table 2, the LED lamps according to the examples 1 to 14 provide uniform light emission in front lights and side leakage lights in all the directions, and quality and characteristic when the white LED lamp is used as a lighting device or the like can be greatly enhanced. It is seen that, in particular, integrating the plural phosphors after satisfying the particle size balance among the phosphors can achieve high uniformity of the emitted lights in all the directions. Moreover, setting the average particle size of the mixed phosphor to 7 μm or more can enhance the brightness of the LED lamp.

Example 15

Using the white LED lamp of the above-described example 5 influence of initial variation of the LED chip on an emission characteristic of the white LED lamp was studied. Since a large number of LED chips are fabricated simultaneously from one semiconductor wafer, characteristics of the LEDs in a center portion and a peripheral portion of the semiconductor wafer sometimes differ. This leads to minute variation in emission wavelength of the LED chips. White LED lamps were fabricated with the use of the LED chips having such initial variation, and influence on emission chromaticity and brightness was studied.

Table 3 shows six ultraviolet emitting LED chips (UV-LED) whose emission wavelengths are minutely different due to the initial variation. Table 3 shows emission wavelength and output of each of the LED chips, and also shows maximum values, and minimum values, and average values of the emission wavelength and output, differences (Δ) between the maximum values and the minimum values, and values equal to Δ divided by the average values. Table 4 shows emission chromaticity and brightness of each of the white lamps which were fabricated with the use of such ultraviolet emitting LED chips respectively. Table 4 shows emission chromaticity and brightness of each of the white LED lamps, and also shows maximum values and minimum values of the chromaticity and brightness, differences (Δ) between the maximum values and the minimum values and average values of the emission chromaticity and brightness and a normalized light flux.

Incidentally, comparative examples shown in Table 3 and Table 4 are white LED lamps each fabricated by using a blue emitting LED chip (B-LED) and a yellow emitting phosphor (YAG phosphor). The blue emitting LED chips also have initial variation similar to that of the ultraviolet emitting LED chips. Six blue emitting LED chips whose emission wavelengths minutely differ due to the initial variation are shown in Table 3. Emission chromaticity and brightness of the white LED lamps fabricated by using such blue emitting LED chips respectively are shown in Table 4.

TABLE 3

|  | | Example | | Comparative Example | |
| --- | --- | --- | --- | --- | --- |
|  | | Wavelength (nm) | Output (Mw) | Wavelength (nm) | Output (Mw) |
| Sample No. | 1 | 405 | 9.0 | 430 | 7.2 |
|  | 2 | 395 | 9.2 | 440 | 7.1 |
|  | 3 | 385 | 10 | 455 | 6.8 |
|  | 4 | 390 | 9.0 | 465 | 7.2 |
|  | 5 | 400 | 9.2 | 455 | 6.5 |
|  | 6 | 375 | 8.8 | 460 | 6.6 |
| Maximum Value | | 405 | 10 | 465 | 7.2 |
| Minimum Value | | 375 | 8.8 | 430 | 6.5 |
| Average Value | | 392 | 9.2 | 451 | 6.9 |
| Δ (Maximum − Minimum) | | 30 | 1.2 | 35 | 0.7 |
| Δ/Average Value | | 0.08 | 0.13 | 0.08 | 0.10 |

TABLE 4

|  | | Example | | | | Comparative Example | | | |
| --- | --- | --- | --- | --- | --- | --- | --- | --- | --- |
|  | | Emission Chromaticity | | | | Emission chromaticity | | | |
|  | | X value | Y value | Brightness (lm/W) | Normalized Light flux | X value | Y value | Brightness (lm/W) | Normalized Light flux |
| Sample No. | 1 | 0.272 | 0.260 | 6.4 | 0.83 | 0.255 | 0.216 | 16.8 | 0.60 |
|  | 2 | 0.280 | 0.262 | 7.1 | 0.91 | 0.266 | 0.233 | 25.1 | 0.89 |
|  | 3 | 0.286 | 0.260 | 8.3 | 1.07 | 0.335 | 0.345 | 41.7 | 1.48 |
|  | 4 | 0.282 | 0.263 | 8.0 | 1.03 | 0.234 | 0.181 | 17.1 | 0.61 |
|  | 5 | 0.277 | 0.267 | 7.0 | 0.90 | 0.275 | 0.247 | 35.4 | 1.26 |
|  | 6 | 0.289 | 0.261 | 9.8 | 1.26 | 0.263 | 0.227 | 32.5 | 1.16 |
| Maximum value | | 0.289 | 0.267 | 9.76 | 1.26 | 0.335 | 0.345 | 41.7 | 1.48 |
| Minimum value | | 0.272 | 0.260 | 6.44 | 0.83 | 0.234 | 0.181 | 16.8 | 0.60 |
| Δ | | 0.017 | 0.008 | 3.32 | 0.43 | 0.101 | 0.164 | 24.9 | 0.89 |
| Average value | | 0.281 | 0.262 | 7.78 | — | 0.271 | 0.242 | 28.1 | — |

As is apparent from Table 3, the ultraviolet emitting LED chips have initial variation in emission wavelength substantially equivalent to that of the blue emitting LED chips Nevertheless, it is seen that the white LED lamps (UV-LED+BGR phosphor) of the example have smaller variation in obtained white light compared with that of the white LED lamps (B-LED+Y phosphor) of the comparative example. This is because ultraviolet light itself is achromatic and the white light comes solely from color of light emitted from the BGR phosphor. Therefore, even with the variation in emission wavelength among the LED chips, variation among the obtained white lights is small. On the other hand, the white LED lamps of the comparative example form white light by using blue light emitted from the LED chips, so that variation in wavelength of blue light directly results in variation in white light.

Example 16

Figure 8:
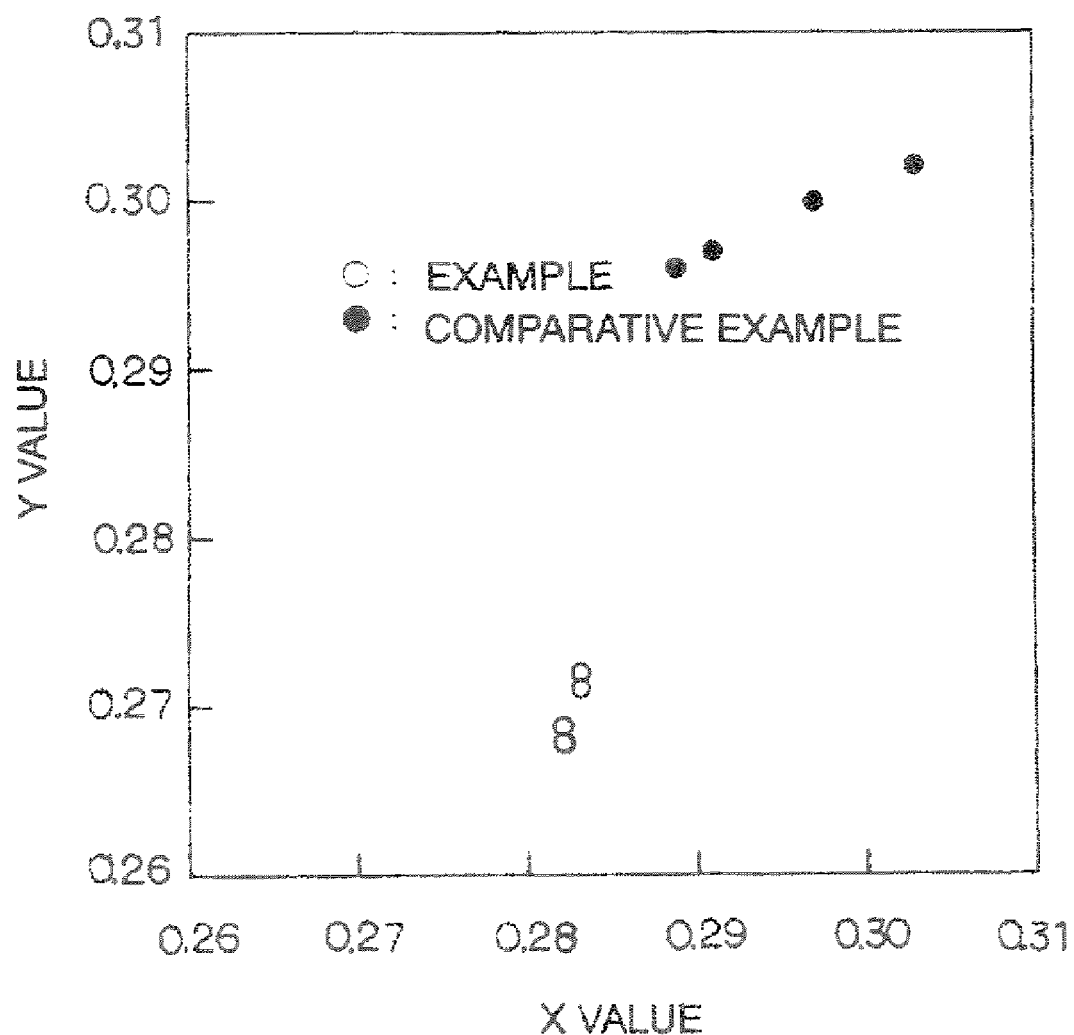
FIG. 8 is a chart showing the correlation between temperature and emission chromaticity of a white LED lamp according to an example 16.

Using the white LED lamp of the above-described example 5, a temperature characteristic of the white LED lamp was studied. To find the temperature characteristic, the white LED lamps were left at temperatures of 25° C., 50° C., 75° C., and 85° C. respectively and thereafter emission chromaticities thereof in the respective temperature states were measured. Table 5 shows emission chromaticity and chromaticity difference at each of the temperatures. Further, FIG. 8 shows emission chromaticity at each of the temperatures. Here, as a comparative example, a white LED lamp was also fabricated with the use of a blue emitting LED chip and a yellow emitting phosphor (YAG phosphor), and a temperature characteristic thereof was studied. Table 5 and FIG. 8 show measurement results of the comparative example as well.

TABLE 5

|  |  | Example (20 mA) Emission Chromaticity | | Comparative Example (150 mA) Emission Chromaticity | |
| --- | --- | --- | --- | --- | --- |
|  |  | x value | y value | x value | y value |
| Temperature | 25° C. | 0.282 | 0.268 | 0.303 | 0.302 |
|  | 50° C. | 0.282 | 0.269 | 0.297 | 0.300 |

TABLE 5-continued

|  |  | Example (20 mA) Emission Chromaticity | | Comparative Example (150 mA) Emission Chromaticity | |
| --- | --- | --- | --- | --- | --- |
|  |  | x value | y value | x value | y value |
|  | 75° C. | 0.283 | 0.271 | 0.291 | 0.297 |
|  | 85° C. | 0.283 | 0.272 | 0.289 | 0.296 |
| Chromaticity Difference |  | 0.001 | 0.004 | −0.014 | −0.006 |

As is apparent from Table 5 and FIG. 8, the white LED lamp (UV-LED+BGR phosphor) of the example is superior in temperature characteristic to the white LED lamp (B-LED+Y phosphor) of the comparative example. Concretely, color difference (absolute value) between emission chromaticities at 25° C. and 85° C. can fall within a range of Δx<0.005 and Δy<0.01. The white LED lamp having such a temperature characteristic is suitable for a backlight or the like of a liquid crystal display. On the other hand, as for the white LED lamp of the comparative example, since the blue emitting LED chip is susceptible to temperature change, the wavelength of blue light forming white light changes, directly leading to variation in the white light.

INDUSTRIAL APPLICABILITY

A light emitting device of the present invention is excellent in uniformity of lights emitted from a light emitting part having a plurality of phosphors different in emission color. Such a light emitting device is useful for application to an industrial use, typically, backlights of various displays and to a general lighting use

What is claimed is:

1. A light emitting device, comprising:
   a light source comprising a light emitting semiconductor element which emits ultraviolet light; and
   a light emitting part comprising a resin layer comprising a plurality of phosphors comprising blue emitting, green emitting, and red emitting phosphors, said phosphors being dispersed in the resin layer and emitting white light when excited by ultraviolet light emitted from the light source,
   wherein each combination of any two of said blue-emitting, green emitting, and red emitting phosphors satisfies a condition represented by an expression:

$-0.2 < \{(D1)^2 \times w1\} - \{(D2)^2 \times w2\} < 0.2,$ where D1 (μm) and w1 (g/mm³) are an average particle size and a density, respectively, of one phosphor among the plurality of phosphors, and D2 (μm) and w2 (g/mm³) are an average particle size and a density, respectively, of another phosphor, and
   wherein the plurality of phosphors are preliminarily bound and integrated by an inorganic binder to form integrated particles before being dispersed in the resin layer, and are present in the resin layer as said integrated particles, and
   wherein a maximum value ($\Delta x$, $\Delta y$) of color difference (absolute value) between emission chromaticity (x, y) and emission chromaticity (x1, y1) satisfies conditions of $\Delta x < 0.05$ and $\Delta y < 0.05$, where (x, y) is emission chromaticity measured directly above the light source and (x1, y1) is emission chromaticity measured for each of front lights and side leakage lights in all directions from the light emitting device.

2. The light emitting device as set forth in claim 1, wherein an average particle size of the plurality of phosphors as a mixture is 7 μm or more.

3. The light emitting device as set forth in claim 1, wherein the light emitting semiconductor element is a light emitting diode or a laser diode.

4. The light emitting device as set forth in claim 1, wherein the light emitting semiconductor element is a light emitting diode having an emission wavelength in a range from 360 to 420 nm.

5. The light emitting device as set forth in claim 1, wherein the light emitting device has a temperature characteristic that color difference ($\Delta x$, $\Delta y$ (absolute value)) between emission chromaticity at 25° C. and emission chromaticity at 85° C. falls within a range of $\Delta x < 0.005$ and $\Delta y < 0.01$.

6. A backlight comprising the light emitting device as set forth in claim 1.

7. A liquid crystal display, comprising:
   a backlight including the light emitting device as set forth in claim 1; and
   a transmissive or transreflective liquid crystal display part disposed on a light emitting face side of the backlight.

8. The light emitting device as set forth in claim 1, wherein the integrated particles are uniformly dispersed in the resin layer.

9. The light emitting device as set forth in claim 1, wherein a ratio of the inorganic binder to a total amount of the plurality of phosphors in the integrated particles is 0.01 to 0.3 mass %.

10. The light emitting device as set forth in claim 1, wherein an average particle size of the integrated particles is 8 μm or more.

11. A method of making the light emitting device of claim 1, comprising covering said light source with said light emitting part.

* * * * *